United States Patent
Huang et al.

(10) Patent No.: US 9,293,633 B2
(45) Date of Patent: *Mar. 22, 2016

(54) COVER FOR PROTECTING SOLAR CELLS DURING FABRICATION

(71) Applicant: TSMC Solar Ltd., Taichung (TW)

(72) Inventors: Chih-Wei Huang, Hsinchu (TW); Keng-Hsin Chi, New Taipei (TW); Chien-Nan Lin, Tongxiao Township (TW); Hua-Tso Wei, Taichung (TW)

(73) Assignee: TSMC Solar Ltd., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/197,321

(22) Filed: Mar. 5, 2014

(65) Prior Publication Data

US 2014/0186992 A1    Jul. 3, 2014

Related U.S. Application Data

(63) Continuation of application No. 13/604,948, filed on Sep. 6, 2012, now Pat. No. 8,697,478.

(51) Int. Cl.
   *H01L 31/18*   (2006.01)
   *H01L 31/048*  (2014.01)

(52) U.S. Cl.
   CPC ............ *H01L 31/18* (2013.01); *H01L 31/048* (2013.01); *Y02E 10/50* (2013.01); *Y10T 29/5313* (2015.01)

(58) Field of Classification Search
   CPC .................................................. H01L 31/048
   See application file for complete search history.

(56) References Cited

U.S. PATENT DOCUMENTS

| | | | | |
|---|---|---|---|---|
| 6,207,603 | B1* | 3/2001 | Danielson | C03C 3/095 136/256 |
| 2008/0264477 | A1* | 10/2008 | Moslehi | H01L 31/022425 136/255 |
| 2010/0243029 | A1 | 9/2010 | Higashi et al. | |
| 2011/0011451 | A1* | 1/2011 | Hakuma | H01L 31/022483 136/255 |
| 2013/0118569 | A1 | 5/2013 | Lee et al. | |
| 2015/0047690 | A1* | 2/2015 | Shen | H01L 31/0481 136/251 |

FOREIGN PATENT DOCUMENTS

TW    201025654 A1    7/2010
TW    200721519 A     9/2010

OTHER PUBLICATIONS

Official Action issued Apr. 9, 2015 in counterpart Taiwan patent application.

* cited by examiner

*Primary Examiner* — Jerome Jackson, Jr.
*Assistant Examiner* — Ankush Singal
(74) *Attorney, Agent, or Firm* — Duane Morris LLP (57) ABSTRACT

A removable cover system for protecting solar cells from exposure to moisture during fabrication processes. The cover system includes a cover having a configuration that complements the configuration of a solar cell substrate to be processed in an apparatus where moisture is present. A resiliently deformable seal member attached to the cover is positionable with the cover to engage and seal the top surface of the substrate. In one embodiment, the cover is dimensioned and arranged so that the seal member engages the peripheral angled edges and corners of the substrate for preventing the ingress of moisture beneath the cover. An apparatus for fabricating a solar cell using the cover and associated method are also disclosed.

20 Claims, 10 Drawing Sheets

COVER FOR PROTECTING SOLAR CELLS DURING FABRICATION

PRIORITY CLAIM AND CROSS-REFERENCE

This application is a continuation of U.S. patent application Ser. No. 13/604,948, filed Sep. 6, 2012, which application is expressly incorporated by reference herein in its entirety.

FIELD

The present disclosure generally relates to thin film solar cells, and more particularly to a cover for temporarily the solar cell and semiconductor layers formed thereon on during fabrication processes.

BACKGROUND

Thin film photovoltaic (PV) solar cells are one class of energy source devices which harness a renewable source of energy in the form of light that is converted into useful electrical energy which may be used for numerous applications. Thin film solar cells are multi-layered semiconductor structures formed by depositing various thin layers and films of semiconductor and other materials on a substrate. These solar cells may be made into light-weight flexible sheets in some forms comprised of a plurality of individual electrically interconnected cells. The attributes of light weight and flexibility gives thin film solar cells broad potential applicability as an electric power source for use in portable electronics, aerospace, and residential and commercial buildings where they can be incorporated into various architectural features such as roof shingles, facades, and skylights.

Thin film solar cell semiconductor packages generally include a conductive back contact or electrode formed on a rear glass or polymer substrate and a conductive front contact or electrode formed above the back electrode. Front electrodes have been made for example of light transmittance conductive oxide ("TCO") film materials. A light-absorbing active or absorber layer ("ABS") is interspersed between front and back electrodes which absorbs the solar radiation photons and excites electrons to produce an electric current thereby chemically converting solar energy into electrical energy.

Processes used to form absorber layers made of chalcogenide materials such as copper indium diselenide species (CIS), copper indium gallium diselenide species or $Cu(In,Ga)Se_2$ ("CIGS") or $Cu(In,Ga)(Se,S)_2$ ("CIGSS") involve a furnace-based selenization/sulfurization process. Generally, base materials such as copper, indium, and gallium (for CIGS or CIGGS absorber layers) are sputtered or otherwise deposited on the back electrode of the solar cell substrate. The substrate is then loaded into a furnace where a carrier gas containing selenide is introduced followed by introducing gas containing sulfide, all of which is coupled with heating.

In additional processes used in forming the thin film solar cell, buffer layers made of cadmium sulfide (CdS) are formed on the absorber layer commonly by a chemical bath deposition (CBD) process wherein the entire substrate is immersed in an electrolytic chemical bath.

The foregoing selenization/sulfurization and CBD processes create unwanted carryover and formation of chemical compound deposits on solar cell surfaces other than the intended target areas. Accordingly, it is generally desirable after forming the foregoing absorber and buffer layers to etch and clean the backside surface of the rear glass substrate to remove any chemical compound debris or deposits that may have adhered to and contaminated this surface to avoid potential performance degradation of the solar cell or appearance defects. The rear substrate backside etching/cleaning operations use a combination of chemical etching, brushing, and water. Chalcogenide absorber layer films formed on the opposite side of the rear glass substrate, however, are susceptible to peeling and other forms of damage if exposed to moisture, water, and etching solutions. This can cause appearance defects and more significantly adversely affects the reliability of the solar cell. Therefore, it is useful to protect the absorber layer from exposure to water and moisture when cleaning the rear substrate.

BRIEF DESCRIPTION OF THE DRAWINGS

The features of the exemplary embodiments will be described with reference to the following drawings where like elements are labeled similarly, and in which.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation.

Terms such as "attached," "affixed," "coupled," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features.

Figure 1:
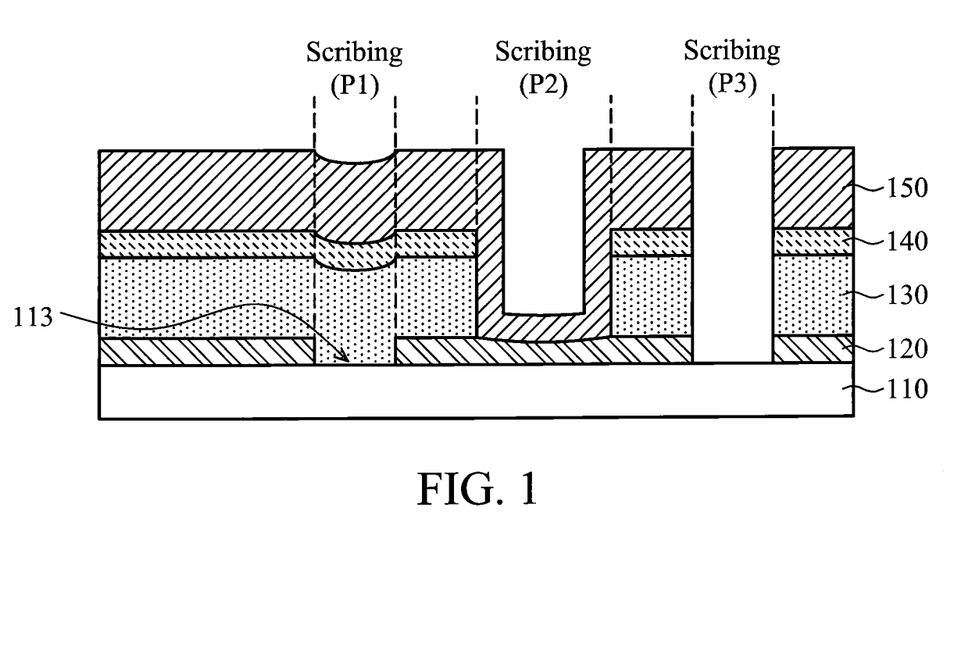
FIG. 1 is a cross-sectional side view of a first embodiment of a thin film solar cell according to the present invention.
Figure 6:
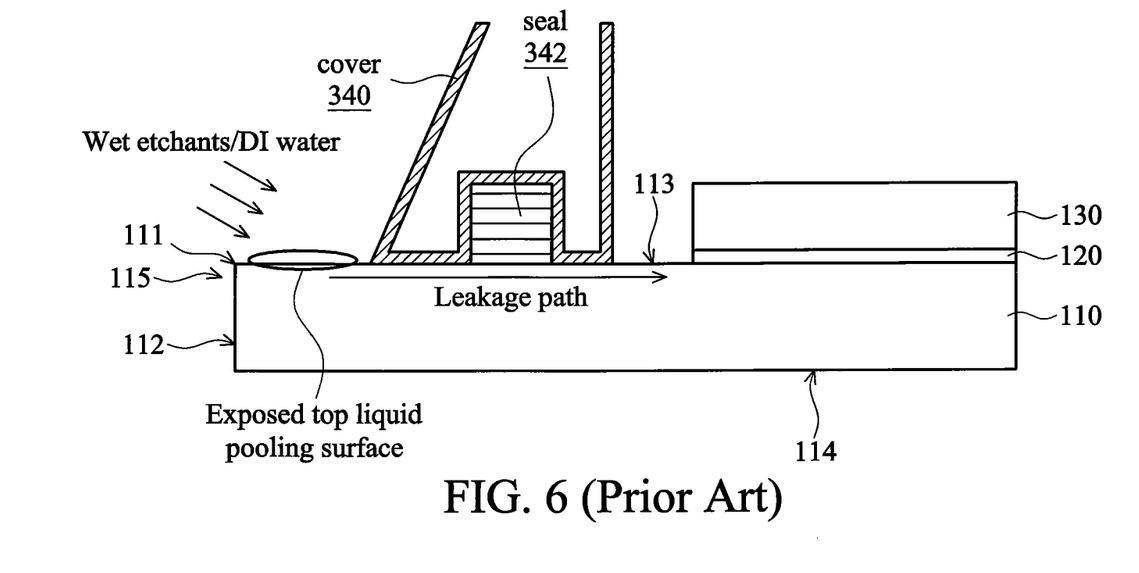
FIG. 6 is a side elevation view of the corner region of the substrate and cover combination of FIG. 5 taken along line 6-6 in FIG. 5.
Figure 7:
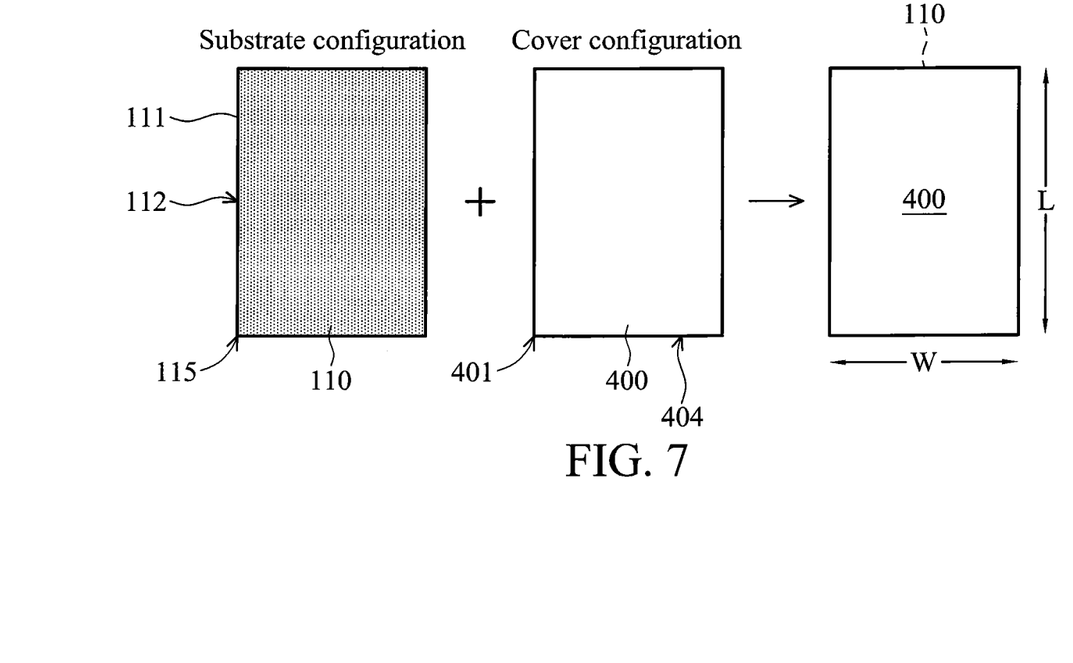
FIG. 7 is a top plan view showing the configuration of a substrate and a protective cover according to the present disclosure.
Figure 9:
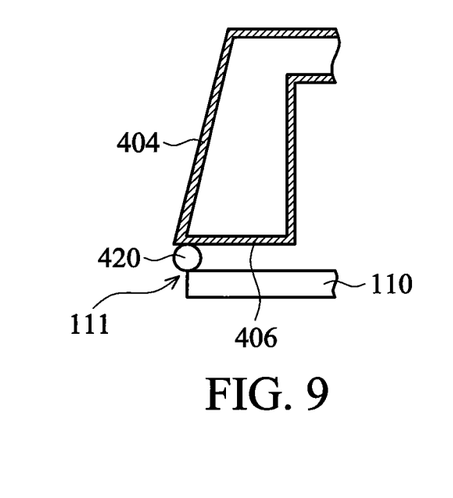
FIG. 9 is an enlarged detailed side elevation view taken from FIG. 8, with a seal member being shown in an uncompressed state positioned on or near the substrate.

FIG. 1 is a cross-sectional view of an exemplary embodiment of a thin film solar cell 100. Solar cell 100 basically includes a rear substrate 110, a bottom electrode layer 120 formed thereon, an absorber layer 130 formed thereon, a buffer layer 140 formed thereon, and a TCO top electrode layer 150 formed thereon. Additional layers and structures may be built above layer 150 to complete the solar cell. As further shown for example in FIGS. 6, 7, and 9, the substrate 110 has a perimeter defined by upper peripheral angled edges 111 extending horizontally around the entire substrate at the top of vertical sides 112 of the substrate (shown in FIGS. 6 and 7). Referring to FIGS. 6, 7, and 9, the edges 111 are angled at 90 degrees in some embodiments forming a point in cross-section (see, e.g. FIG. 9) and corresponding linear edge that extends horizontally completely around the entire perimeter of the substrate (see, e.g. FIG. 7).

Solar cell 100 further includes micro-channels which are patterned and scribed into the semiconductor structure to interconnect the various conductive material layers and to separate adjacent solar cells. These micro-channels or "scribe lines" as commonly referred to in the art are given "P" designations related to their function and step during the semiconductor solar cell fabrication process. P1 scribe lines interconnect the absorber layer 130 to the substrate 110. P2 scribe line forms a conductive connection between the bottom and top electrodes 120 and 150. P3 scribe lines extend completely through the foregoing solar cell layers to the rear substrate 110 to isolate adjacent solar cells.

Figure 2:
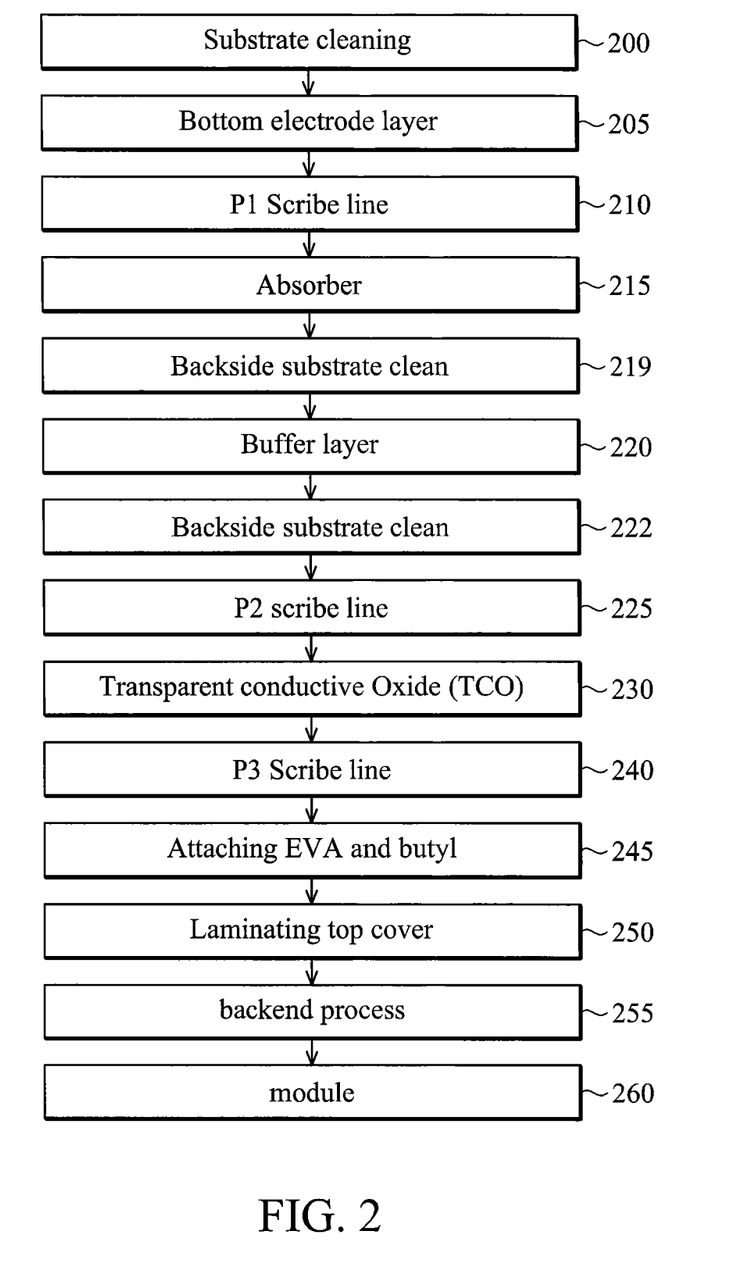
FIG. 2 is a flow chart showing sequential steps in an exemplary process for the formation thereof.

An exemplary method for forming solar cell 100 is shown in the sequential steps in FIG. 2.

Referring now to FIGS. 1 and 2, rear substrate 110 is first cleaned in step 200 by any suitable means used in the art to prepare the substrate for receiving the bottom electrode layer. In one embodiment, substrate 110 may be cleaned by using detergent or chemical in either brushing tool or ultrasonic cleaning tool.

Suitable materials that may be used for rear substrate 110 include without limitation glass such as for example without limitation soda lime glass, ceramic, metals such as for example without limitation thin sheets of stainless steel and aluminum, or polymers such as for example without limitation polyamides, polyethylene terephthalates, polyethylene naphthalates, polymeric hydrocarbons, cellulosic polymers, polycarbonates, polyethers, and others. In one embodiment, glass may be used for rear substrate 110.

Next, bottom electrode layer 120 is then formed on a substrate 110 (step 205) by any method used in the art including without limitation sputtering, atomic layer deposition (ALD), chemical vapor deposition (CVD), or other techniques.

In one embodiment, bottom electrode layer 120 may be made of molybdenum (Mo); however, other suitable electrically conductive metallic and semiconductor materials used in the art may be used such as Al, Ag, Sn, Ti, Ni, stainless steel, ZnTe, etc.

In some representative embodiments, without limitation, bottom electrode layer 120 may preferably have a thickness ranging from about and including 0.1 to 1.5 microns (μm). In one embodiment, layer 120 has a representative thickness on the order of about 0.5 μm.

With continuing reference to FIGS. 1 and 2, P1 patterned scribe lines are next formed in bottom electrode layer 120 (step 210) to expose the top surface 113 of substrate 110 as shown. Any suitable scribing method commonly used in the art may be used such as without limitation mechanical scribing with a stylus or laser scribing.

A p-type doped semiconductor light absorber layer 130 is next formed on top of bottom electrode layer 120 (step 215). The absorber layer 130 material further fills the P1 scribe line and contacts the exposed top surface 113 of substrate 110 to interconnect layer 130 to the substrate, as shown in FIG. 1.

In some embodiments, absorber layer 130 is a p-type doped chalcogenide material commonly used in the art, such as without limitation $Cu(In,Ga)Se_2$ or "CIGS." Other suitable chalcogenide materials may be used including without limitation $Cu(In,Ga)(Se, S)_2$ or "CIGSS," $CuInSe_2$, $CuGaSe_2$, $CuInS_2$, $Cu(In,Ga)S_2$, or other combinations of elements of group II, III or VI of the periodic table of elements. In some representative embodiments, without limitation, absorber layer 130 may preferably have a thickness ranging from about and including 0.5 to 5.0 microns (μm). In one embodiment, absorber layer 130 has a representative thickness on the order of about 2 μm.

Absorber layer 130 formed of CIGS may be formed by any suitable vacuum or non-vacuum process used in the art. Such processes include, without limitation, selenization, sulfurization after selenization ("SAS"), evaporation, sputtering electrodeposition, chemical vapor deposition, ink spraying, etc. (step 215).

The selenization and sulfurization processes of step 215 when used typically leave deposits or residues of organic and/or inorganic compounds on the backside or bottom surface 114 of rear substrate 110 (identified in FIG. 4) which is removed by a substrate backside cleaning process (step 219). Such cleaning processes generally include a combination of chemical etching with mechanical brushing and water cleansing of the backside substrate surface. This cleaning process is further described in detail below.

With continuing reference now to FIGS. 1 and 2, an n-type buffer layer 140 which may be CdS (cadmium sulfide) is then formed on absorber layer 130 to create an electrically active n-p junction (step 220). Buffer layer 140 may be formed any suitable method commonly used in the art. In one embodiment, buffer layer 140 may be formed by an electrolyte chemical bath deposition (CBD) process using an electrolyte solution that contains sulfur. In some representative embodiments, without limitation, buffer layer 140 may preferably have a thickness ranging from about and including 0.005 to 0.15 microns (μm). In one embodiment, buffer layer 140 has a representative thickness on the order of about 0.015 μm.

The CBD process of forming CdS buffer layer also typically leaves deposits or residues of organic and/or inorganic chemical compounds on the backside or bottom surface 114 of rear substrate 110, which is removed by repeating the same substrate cleaning process (step 222) previously noted above following sulfurization and selenization processes (step 215) used in some embodiments for forming absorber layer 130. This cleaning process is further described in detail below.

After forming CdS buffer layer 140, the P2 scribe lines are next cut through the absorber layer 130 to expose the top surface 113 of the bottom electrode 120 within the open scribe line or channel (step 225). Any suitable method used in the art may be used to cut the P2 scribe line as previously described, including without limitation mechanical (e.g. cutting stylus) or laser scribing. The P2 scribe line will later be filled with a conductive material of top electrode layer 150 to interconnect the top electrode to the bottom electrode layer 120.

With continuing reference to FIGS. 1 and 2, after forming the P2 scribe lines, a light transmitting n-type doped top electrode layer 150 preferably made of a TCO material is next formed on top of buffer layer 140 for collecting current (electrons) from the cell and preferably absorbing a minimal amount of light which passes through to the light absorbing layer 130 (step 230). This creates additional active surface area for the collection of current by the top electrode which carries the charge to an external circuit. The P2 scribe line is also at least partially filled with the TCO material as shown in FIG. 1 on the vertical sidewalls of the P2 line and on top of bottom electrode layer 120 therein to form an electrical connection between the top electrode layer 150 and bottom electrode 120 creating an electron flow path.

Aluminum (Al) and Boron (B) are two possible n-type dopant that is commonly used for TCO top electrodes in thin film solar cells; however, others suitable dopants may be used such as without limitation Aluminum (Al), Boron (B), Gallium (Ga), Indium (In) or other elements of group III of the periodic table.

In one embodiment, the TCO used for top electrode layer 150 may be any material commonly used in the art for thin film solar cells. Suitable TCOs that may be used include without limitation zinc oxide (ZnO), Boron doped ZnO ("BZO"), Aluminum doped ZnO ("AZO"), Gallium doped ZnO ("GZO"), Indium doped ZnO ("IZO"), fluorine tin oxide ("FTO" or $SnO_2$:F), or indium tin oxide ("ITO"). Top electrode layer 150 may be formed of any other suitable coating materials possessing the desired properties for a top electrode, such as a carbon nanotube layer. In one embodiment, the TCO used is BZO.

In some embodiments where top electrode layer 150 may be made of Boron doped ZnO or "BZO", it should be noted that a thin intrinsic ZnO film may form on top of absorber layer 130 (not shown) during formation of the thicker n-type doped TCO top electrode layer 150.

With continuing reference to FIGS. 1 and 2, following formation of TCO top electrode layer 150, the P3 scribe line is formed in thin film solar cell 100 (step 240). The P3 scribe line extends through (from top to bottom) top electrode layer 150, buffer layer 140, absorber layer 130, and the bottom electrode layer 120 down to the top of substrate 110 as shown.

Additional final back end steps are then taken to complete the solar cell module, which are well known and understood by those skilled in the art. This includes laminating a top cover (not shown), such as a glass cover, onto the cell structure with a suitable encapsulant such as without limitation a combination of EVA (ethylene vinyl acetate) and butyl to seal the solar cell (steps 245 and 250 in FIG. 2).

Further back end processes (step 255) are performed which may include forming front conductive grid contacts and one or more anti-reflective coatings (not shown) above top electrode 150 by a manner known in the art. The grid contacts will protrude upwards through and beyond the top surface of any anti-reflective coatings for connection to external circuits. This produces a completed solar cell module (step 260).

Backside Etching and Cleaning Apparatus

Figure 3:
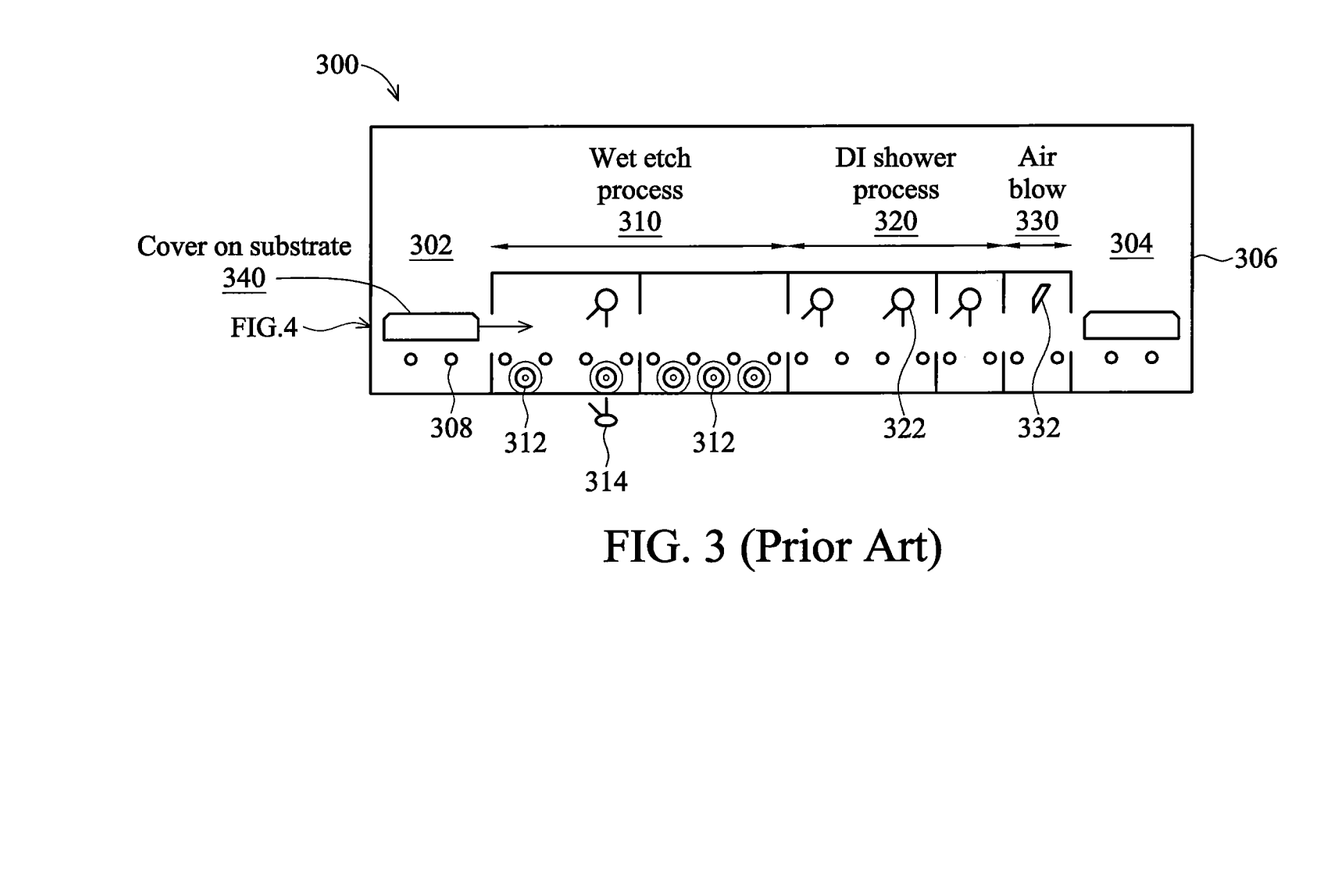
FIG. 3 is a schematic side elevation drawing of a conventional substrate backside wet etching/cleaning apparatus.

FIG. 3 is a schematic diagram of apparatus 300 that is useable for performing the rear substrate 110 backside etching and cleaning operations shown in steps 219 and 222 in FIG. 2 and described above. The apparatus 300 embodies an inline process system that includes a loading section 302, wet etch process section 310, wet rinsing or shower section 320, an air blow or dry section 330, and unloading section 304. Apparatus 300 includes an elongated process enclosure 306 extending longitudinally from the loading section 302 to unloading section 304 as shown. This creates a controlled environment around the solar cell 100 (or partially formed solar cell) for performing the sequential etching, rinsing, and air drying operations. The apparatus 300 includes all appropriate and necessary auxiliary equipment to perform each operation such as, for example, liquid chemical storage and dispensing equipment, pumps, motors, brushes, blower/fans, wiping blades, power supply, controls, etc. Etching and cleaning apparatuses as diagrammatically shown are commercially available such as VITRUM-Etch 2000 and VITRUM-Clean 2000 tools from Singulus of Kahl, Germany.

During the etching and cleaning process, solar cell substrates 110 are received in the loading section 302 shown in FIG. 3 at the left. At step 219 in the solar cell 100 fabrication process shown in FIG. 2, the absorber layer 130 has already been formed on rear substrate 110 (step 215) and underwent processing in the selenization furnace thereby requiring removal of unwanted residual chemical compound deposits from the backside (i.e. bottom surface 114, FIG. 6) of the substrate (step 219). This would be a first etching/cleaning operation on the solar cell 100. Alternatively, the CdS buffer layer 140 may have just been formed via CBD (step 220) before a second etching/cleaning operation (step 222). In either case of a first or second cleaning operation (step 219 or 222), the substrate 110 with absorber layer 130 formed on the opposing front side of substrate 110 requires protection from the etching/cleaning process as described above on the backside.

Figure 4:
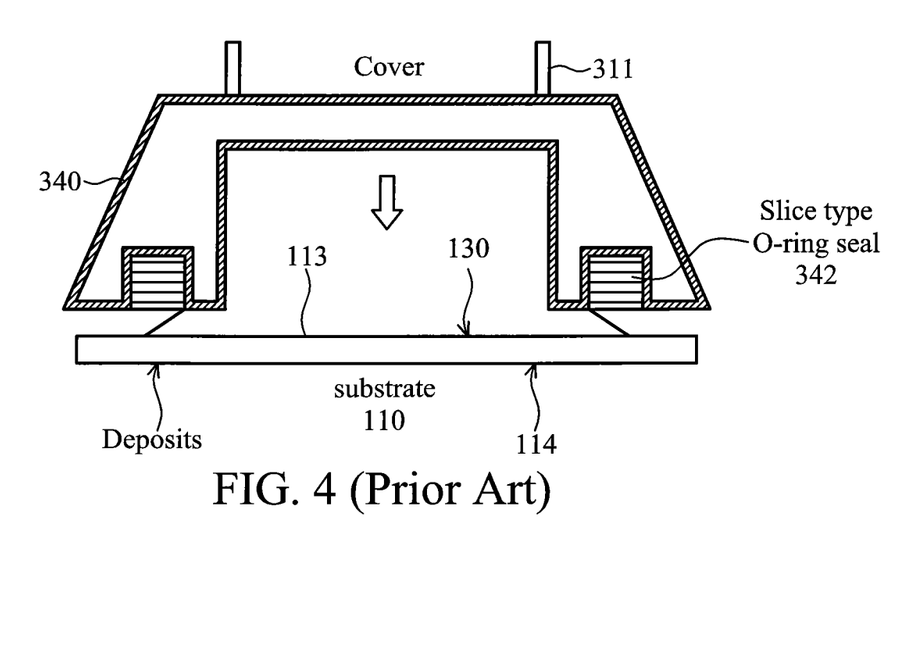
FIG. 4 is a cross-sectional side elevation view of a conventional protective substrate cover used in the apparatus of FIG. 3.

Referring to FIGS. 3 and 4, a protective cover 340 is placed on top of substrate 110 in the loading chamber 302. FIG. 4 is an enlarged view from FIG. 3 showing the cover in the process of being positioned on the substrate (see downward arrow). The cover 340 may be supported and connected temporarily to apparatus for loading into the wet etch process section 310, and unloading from the air blow or dry section 330 by a suitable structural frame 311 of appropriate configuration. The apparatus 300 includes a cover handling system which is configured and operable to raise and lower cover 340 via the frame 311, and to maintain engagement between the cover 340 and substrate 110 during processing. The cover 340 is pressed downwards onto an upper flat perimeter portion of the top surface 113 of the substrate 110 (see FIGS. 4 and 6) in the cover loading section 302. A peripheral seal 342 of the slice-type o-ring style extends completely around the perimeter of the cover 340 is compressed against the upper surface to form a seal to protect absorber layer 130 within the cover 340 during the etching and cleaning processes to follow. This type seal has an outwardly flared section (typically disposed at about 45 degrees) as shown in FIG. 4 which folds upward and flattens when pressed downward against the substrate.

Next in the etching/cleaning process (steps 219 or 222 in FIG. 2), the protected substrate 110 with cover 340 in place flows from left to right in FIG. 3 and first moves through the wet etch process section 310 of the apparatus 300 to removed the chemical compounds from the backside or bottom surface 114 of rear substrate 110. In some embodiments, the substrates 110 may move automatically on a conveyor (schematically represented by the plurality of rollers 308) through apparatus 300. The cover handling system releases cover 340 after it leaves the loading section 302 and enters process section 310. The apparatus 300 maintains pressure against the cover, which remains sealed with substrate 110. A combination of wet or liquid etching chemicals such as $H_2O_2$ (hydrogen peroxide) and/or others dispensed by a plurality of chemical spray nozzles 314 and mechanical brushing of the backside of substrate 110 by a plurality of brushes 312 are used to removed the chemical compound deposits from the backside surface of the substrate 110.

With continuing reference to FIG. 3, the protected substrate 110 next moves through the wet rinsing or shower section 320 where a plurality of deionized water (DI) spray nozzles 322 wet the exposed portions of the substrate and cover 340 to rinse away any residual etching chemicals. After rinsing, the substrate 110 moves through the air blow or dry section 330 where one or more blowers 332 drive high pressure clean air across the cover 340 and exposed portions of the substrate to remove significant amounts of residual water and moisture. The substrate 110 next moves into the unloading section 304 as shown at right. At this point, the substrate 110 has left the active process sections or chambers 310, 320, and 330 and the protective cover 340 may now be lifted off of the substrate by the cover handling system via frame 311. The apparatus 300 returns the cover 340 to the loading section 302 for application to another substrate to be processed for backside etching/cleaning.

In certain circumstances, the protective cover 340 shown in FIGS. 3 and 4 may not be completely effective at preventing infiltration of some amount of liquid chemicals and/or water underneath the cover during backside etching/cleaning. The liquid chemicals and/or water can sometimes find a leakage pathway beneath the seal and reach the absorber layer 130 and damage aesthetically and structurally the absorber layer 130 as well as compromising performance of the solar cell being fabricated. Several factors may contribute to such leakage.

Figure 5:
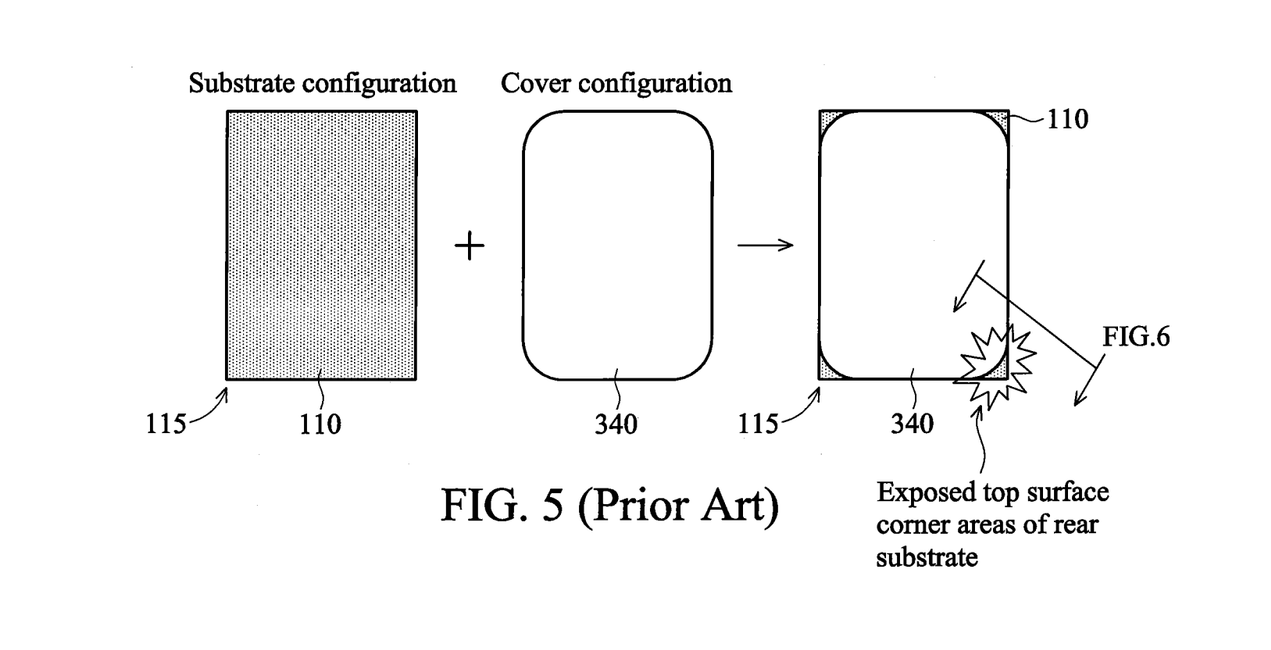
FIG. 5 is a top plan view showing the configuration of a substrate and cover of FIG. 4.

For example, solar cell substrates 110 are typically rectangular in configuration as shown in FIG. 5. Conversely, the protective covers 340 may not conform perfectly in configuration particularly along the entire perimeter to the shape of the substrate 110, and in some embodiments the cover may have rounded or arcuate corners as shown in FIG. 5. When the cover is placed on the substrate as described above, the corner portions on the top surface 113 of substrate 110 remain exposed as shown to the apparatus 300 wet processes described herein. This creates exposed flat upper corner 115 surface areas where the liquid chemicals and/or water dispensed at pressure both above and below the substrate may pond or pool and be driven underneath the seal 342 to reach the absorber layer 130 (see, e.g. FIG. 6). Rinse water remaining on these exposed corner 115 surface areas of substrate 110 may similarly be driven underneath seal 342 in the air dry section 330 by the high pressure blowers analogously to wind-driven rain. Since the seal 342 engages the top flat surface 113 of the substrate 110 at least at the corners due the non-conformal shaped cover 340 (i.e. flat-to-flat surface contact), slight surface imperfections on the top surface 113 beneath the seals 342 can create pathways for moisture and liquid to leak underneath the cover and reach absorber layer 130.

To minimize or eliminate the foregoing potential leakage problems, FIGS. 7-10 show various embodiments of a protective cover system including a conformal cover 400 and seal member 420 according to the present disclosure. Unlike the foregoing cover 340 system shown for example in FIGS. 5 and 6, cover 400 is configured to form a water-resistant seal between the linear-shaped upper angled edge 111 of substrate 110 and seal member 420 directly (see FIG. 8) instead of the flat top substrate surface 113 to seal 342 interface as in cover 320 (see FIG. 6). This edge sealing interface according to the present disclosure provides improved protection against moisture penetration and eliminates any flat exposed top surface 113 areas on the substrate 110 (particularly at corners 115) which pool liquid that can enter beneath the cover seal as described above. The peripheral angled edges 111 of substrate 110 provided linear engagement with seal member 420 that creates a water-tight seal with the cover 400.

Referring to the top view in FIG. 7, to achieve the edge sealing particularly at the corners 115 of rear substrate 110, the peripheral edges of cover 400 conforms to and complements the shape (in top or planar view as shown) of the substrate 110. In various embodiments, for example without limitation, cover 400 may have rectangular, rectangular with rounded corners, polygonal, or circular shapes depending on the shape of the substrate. In the embodiments shown, the shapes of cover 400 and substrate 110 are rectangular. The four corners 401 of cover 400 particularly matches the configuration of the corners 115 of substrate 110 (in top plan view) to achieve edge sealing all the way around the perimeter of the substrate (see FIG. 7).

Dimensionally, cover 400 has an outer size of length and width that is the same or slightly larger than the length and width of substrate 110. In various embodiments, the seal member 420 is attached to the cover 400 and still engage the linear edge of substrate 110, the cover is slightly larger in width and length than the substrate to accommodate the sealing member 420.

Protective cover 400 may be made of any suitable material include plastics or metals. In one embodiment, cover 400 is made of polycarbonate, which may be clear or opaque. Accordingly, cover 400 may be of unitary construction and formed by any suitable process including molding, casting, stamping, pressure extrusion, etc depending on the material used. The cover 400 has a suitable thickness to provide the structural strength needed to form a substantially rigid cover in structure to resist bending, deflection, or warping during processing in apparatus 300 which might otherwise compromise the leak-resistant performance of the cover system.

Figure 8:
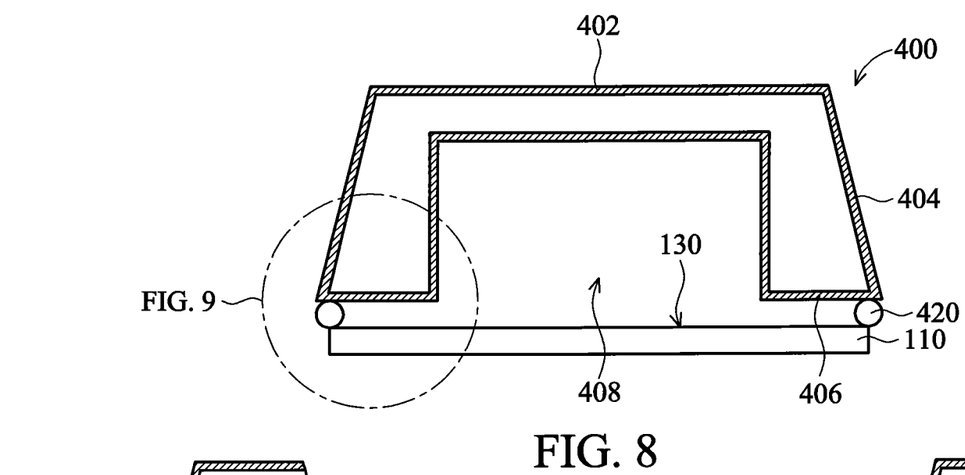
FIG. 8 is a cross-sectional side elevation view of the cover of FIG. 7 on a substrate.
Figure 10:
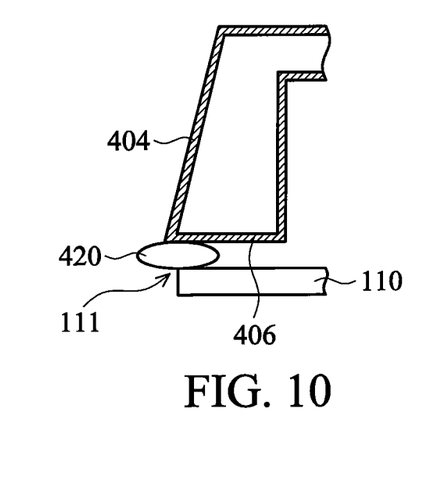
FIG. 10 is an enlarged detailed side elevation view thereof, with the seal member being shown in a compressed state against the substrate.

Referring to FIGS. 8-10, covers 400 include a generally horizontal top section 402 and vertical sidewalls 404 extending downwardly from the top section 402. The vertical sidewalls 404 define an internal cavity 408 of sufficient height and area to cover substrate 110 therein without damaging any solar cell layers already formed thereon such as absorber layer 130. In some embodiments, the sidewalls 404 define a peripheral edge and perimeter of the cover 400. In one embodiment, top section 402 is substantially flat or slightly domed. Sidewalls 404 may be oriented perpendicular to top section 402 or be slightly angled, as shown. A peripheral bottom surface 406 is formed at the bottom edge of and underneath each sidewall 404 that extends around the perimeter of cover 400. Bottom surface 406 has a sufficient width to allow the cover 400 to rest with stability on substrate 110 and to accommodate the lateral width of seal member 420 that is to the bottom surface 406.

According to various embodiments, seal member 420 is a highly compressible and deformable elastomeric member with a great degree of resiliency in configuration and structure to maximize the effectiveness of the temporary sealing of protective cover 400 to the peripheral edges of substrate 110 during backside substrate etching/cleaning in apparatus 300 of FIG. 3. In some embodiments, seal member 420 is made of a foam rubber, for example, EDPM (Ethylene-Propylene-Diene Monomer) closed cell sponge. EPDM possesses the desired compressible and resiliency or memory characteristics for a leak-resistant seal over repeated cycles of compression and expansion. Other highly deformable seal materials may be used such as without limitation natural or synthetic rubber, silicone rubber, butyl rubber, neoprene rubber, or NBR (Nitrile butadiene rubber) of suitable configuration.

In operation, apparatus 300 initially positions cover 400 onto substrate 110 wherein seal member 420 is located proximate to, or slightly engages, edge 111 of the substrate as shown in FIGS. 8 and 9. Seal member 420 is in an undeformed and uncompressed state as best shown in FIG. 9. The cover 400 is then pressed downwards against substrate 110 wherein edge 111 of the substrate deforms and at least partially compresses seal member 420 (see FIG. 10) sufficiently to produce a leak-resistant seal around the peripheral edges of the substrate. Seal member 420 is in a compressed state and operative to seal the cover 400 to the substrate 110 to begin the backside cleaning process.

Figures 11, 12:
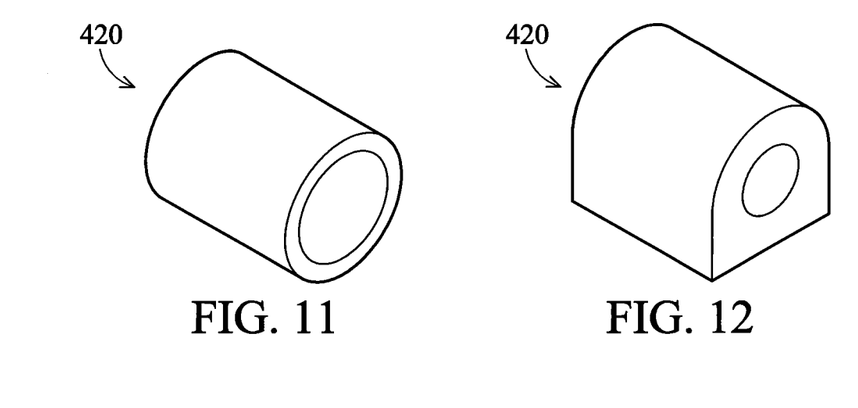
FIGS. 11-15 are cross-sectional perspective views of several embodiments of seal members useable with the cover of FIG. 9.
Figure 13:
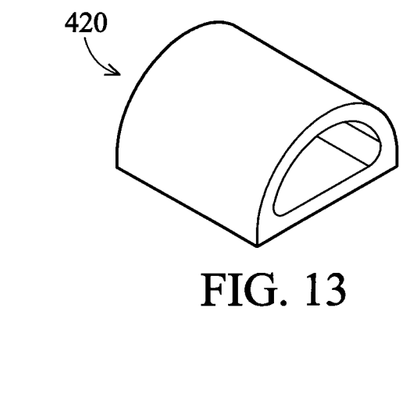
Figure 14:
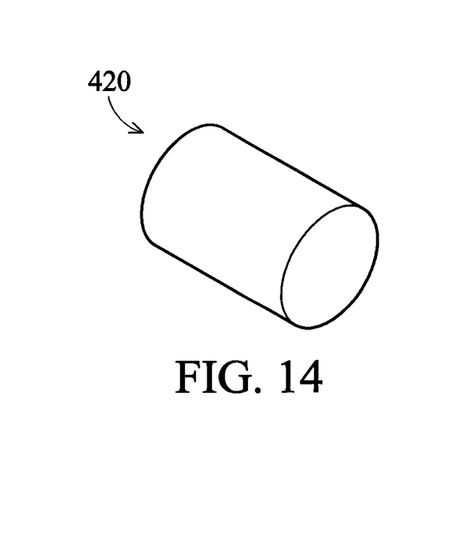
Figure 15:
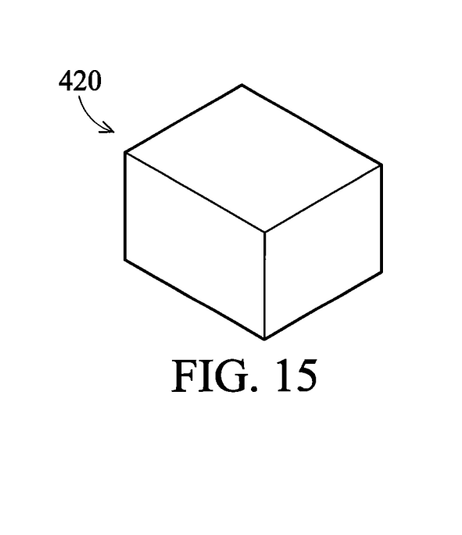

Seal member 420 may have numerous cross-sectional configurations including open structures of varying configurations such as shown in FIGS. 11-13 having an open central region surrounded by a wall of seal material, or closed solid structures of varying configurations such as shown in FIGS. 14-15. The structural type (i.e. open or closed) and cross-sectional configuration will depend in part on the method selected to attach the seal member 420 to cover 400, degree of deformability desired, and configuration and size of the sidewall bottom surface 406 provided. In some embodiments, seal member 420 has the general configuration of an O-ring or modified O-ring shape as shown in FIGS. 11-13. In one embodiment, seal member 420 is an O-ring with a has a D-shape cross-section as shown in FIG. 13.

Seal member 420 has a length suitable to extend completely around the perimeter of cover 400 on sidewall bottom surface 406 so that there are no gaps present through which moisture may infiltrate beneath the cover to reach absorber layer 130 on substrate 110. Accordingly, the total combined length of seal member 420 is the same as the total combined length of the peripheral angled edge 111 of substrate 110 extending completely around the substrate. The seal member 420 may be spliced, mitered, or otherwise joined together such as at the corners 401 of cover 400 to form a continuous loop seal extending around the entire perimeter of the cover.

Figure 16:
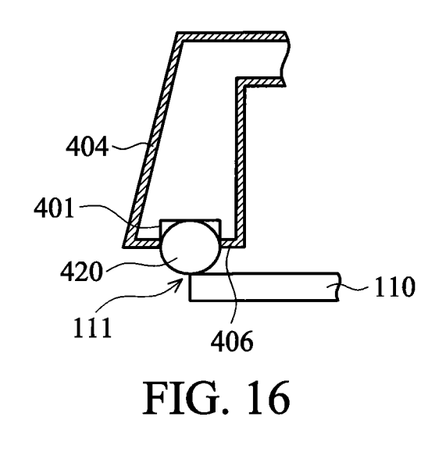
FIG. 16 is an enlarged detailed side elevation view of the protective cover of FIG. 9 showing an alternative mounting arrangement of the seal member.

Seal member 420 may be attached to bottom surface 406 of cover 400 by any suitable means including adhesives in some embodiments. Configurations of seal member 420 having a flat side or surface such as shown in FIGS. 12, 13, and 15 may be easily attached using an adhesive when the bottom surface 406 has a flat profile. In other embodiments as shown in FIG. 16, the bottom surface 406 includes a mounting groove 401 to receive a portion of seal member 420 secure the seal in position on cover 400 via a frictional fit in addition to or instead of using adhesives. Any of the cross-sectional configurations of seal members shown may be used with a mounting groove 401. Particularly, the seals without a flat side or surface such as those shown in FIGS. 11 and 14 may be used in a more secure seal with a mounting groove by positively locating the seal in the sidewall bottom surface 406.

In some embodiments, the cover 400 and seal member 420 are configured and arranged so that the upper peripheral angled edges 111 of substrate 110 will engages the seal proximate to the midpoint of the seal as shown in FIGS. 9, 10, and 16 for maximum deformation and sealing effectiveness.

It will be appreciated that the embodiments of the protective cover system described herein are not only suitable for providing protective moisture barriers for CIGS-based absorber layer solar cells, but may also be used with equal benefit for CdTe-based and other type thin film solar cells which may be susceptible to moisture damage.

According to one aspect of the present disclosure, a removable cover system for protecting solar cell substrates during fabrication processes is provided. The solar cell substrate has a top surface, bottom surface, and a perimeter defined by peripheral angled edges extending horizontally around the solar cell substrate. The cover system includes a cover having a top section and peripheral sidewalls that form an internal cavity, the peripheral sidewalls defining a perimeter which extends horizontally around the cover, the perimeter being approximate to the perimeter of the solar cell substrate, and a resiliently deformable seal member attached to the sidewalls and extending around the perimeter of the cover, wherein the seal member is configured to seal the top surface of the solar cell substrate at the peripheral angled edges when the cover is engaged to the solar cell substrate. In one embodiment, when the cover is placed on the substrate, the cover is dimensioned and arranged so that the seal member engages the peripheral angled edges of the substrate for preventing the ingress of moisture beneath the cover. In one embodiment, the solar cell substrate has a rectangular or square configuration with square corners formed between two opposing pairs of peripheral angled edges, and the cover has a matching rectangular or square configuration with square corners formed between two opposing pairs of sidewalls. In one embodiment, the perimeter of the cover is configured and dimensioned to have a complementary shape to the solar cell substrate so that the cover completely covers the top surface of the substrate when placed thereon.

According to another aspect of the present disclosure, a solar cell fabrication process apparatus is provided. A solar cell fabrication process apparatus includes a process enclosure including at least one wet solar cell fabrication process, a cover having a top section and peripheral sidewalls that form an internal cavity, the peripheral sidewalls defining a perimeter which extends horizontally around the cover, the perimeter being approximate to a perimeter of a partially fabricated solar cell substrate. The apparatus further includes a resiliently deformable seal member attached to the sidewalls and extending around the perimeter of the cover, and a frame attachable to the cover and connected to the apparatus. The apparatus is operable to lower the cover into a closed position engaged with a top surface of the solar cell substrate and to raise the cover off of the top surface of the solar cell substrate into an open position disengaged with the solar cell substrate. The seal member is configured to seal the top surface of the solar cell substrate at the peripheral angled edges when the cover is at the closed position.

According to yet another aspect of the present disclosure, a method for fabricating solar cells is provided. The method includes: depositing a conductive bottom electrode layer on a top surface of a substrate; depositing an absorber layer on the bottom electrode layer; performing selenization on the absorber layer; protecting the absorber layer by placing a protective cover on the top surface of the substrate, wherein a resiliently deformable seal member on the cover engages peripheral angled edges of the substrate to effectuate a leak-resistant seal; and wet etching a bottom surface of the substrate with the protective cover positioned on the top surface of the substrate to remove selenization compound deposits While the foregoing description and drawings represent exemplary embodiments of the present disclosure, it will be understood that various additions, modifications and substitutions may be made therein without departing from the spirit and scope and range of equivalents of the accompanying claims. In particular, it will be clear to those skilled in the art that various embodiments according to the present disclosure may be configured in other forms, structures, arrangements, proportions, sizes, and with other elements, materials, and components, without departing from the spirit or essential characteristics thereof. In addition, numerous variations in the exemplary methods and processes described herein may be made without departing from the present disclosure. The presently disclosed embodiments are therefore to be considered in all respects as illustrative and not restrictive, the scope of the claimed invention being defined by the appended claims and equivalents thereof, and not limited to the foregoing description or embodiments.

What is claimed is:

1. A removable cover system for protecting a solar cell substrate during a fabrication process, the solar cell substrate having a top surface, a bottom surface, and a perimeter, the system comprising:
 a cover having a top section and peripheral sidewalls that form an internal cavity, the peripheral sidewalls defining a perimeter, the perimeter in a position entirely covering the perimeter of the solar cell substrate; and
 a resiliently deformable seal member attached to the cover around the perimeter of the cover, wherein the seal member is configured to seal the top surface of the solar cell substrate when the cover is engaged to the solar cell substrate.

2. The cover system of claim 1, wherein the solar cell substrate has a rectangular or square shape.

3. The cover system of claim 2, wherein the cover has a length and width that is dimensioned to be at least the same as or larger than a corresponding length and width of the solar cell substrate.

4. The cover system of claim 1, wherein the seal member is attached to a bottom surface of the peripheral sidewalls of the cover.

5. The cover system of claim 1, wherein the seal member includes foam rubber having a closed cell structure.

6. The cover system of claim 1, wherein the seal member is made of a material selected from a group consisting of EPDM (ethylene-propylene-diene) material, synthetic rubber, silicone rubber, butyl rubber, neoprene rubber and NBR (nitrile butadiene) rubber.

7. The cover system of claim 1, wherein the perimeter of the solar cell substrate is defined by peripheral angled edges extending horizontally around the solar cell substrate, and the seal member is configured to engage the peripheral angled edges of the solar cell substrate about mid-way between lateral sides of the seal member.

8. The cover system of claim 1, wherein the seal member has a hollow cross-sectional structure.

9. The cover system of claim 8, wherein the seal member has a cross-sectional shape selected from the group consisting of an o-ring and a d-ring.

10. The cover system of claim 1, wherein the top surface of the solar cell substrate includes an absorber layer, the absorber layer being positioned beneath the cover and interior to the seal member when the cover is engaged to the solar cell substrate.

11. The cover system of claim 1, wherein the perimeter of the cover is configured and dimensioned so that the cover completely covers an outer edge of the top surface of the substrate when the cover is engaged to the solar cell substrate.

12. A solar cell fabrication process apparatus comprising:
 a process enclosure; and
 a removable cover system of claim 1.

13. The apparatus of claim 12, wherein the apparatus is operable to apply a downward force to the cover at the closed position.

14. The apparatus of claim 12, further comprising:
 a frame attachable to the cover and connected to the apparatus, the apparatus being operable to lower the cover into the closed position such that the cover is engaged with a top surface of the solar cell substrate and to raise the cover off of the top surface of the solar cell substrate into an open position such that the cover is disengaged from the solar cell substrate.

15. The apparatus of claim 12, wherein the process enclosure is configured to perform at least one wet solar cell fabrication process, and the at least one wet solar cell fabrication process comprises wet substrate backside etching performed on a bottom surface of the substrate.

16. The apparatus of claim 12, wherein the cover has a length and width that is dimensioned to be at least the same as or larger than a corresponding length and width of the solar cell substrate.

17. The cover system of claim 12, wherein the seal member includes foam rubber having a cross-sectional shape selected from the group consisting of an o-ring and a d-ring, and
 wherein the perimeter of the solar cell substrate is defined by peripheral angled edges extending horizontally around the solar cell substrate, and the seal member is configured to engage the peripheral angled edges of the solar cell substrate about mid-way between lateral sides of the seal member.

18. A removable cover system for protecting a solar cell substrate during a fabrication process, the solar cell substrate having a top surface, a bottom surface, and a perimeter, the system comprising:
 a cover having a top section and peripheral sidewalls that form an internal cavity, the peripheral sidewalls defining a perimeter, the perimeter in a position entirely covering the perimeter of the solar cell substrate; and
 a resiliently deformable seal member attached to the cover around the perimeter of the cover, wherein the seal member is configured to seal the top surface of the solar cell substrate when the cover is engaged to the solar cell substrate, and the seal member is attached to a bottom surface of the peripheral sidewalls of the cover.

19. The cover system of claim 18, wherein the seal member has a cross-sectional shape selected from the group consisting of an o-ring and a d-ring, and a cross-sectional configuration having a closed solid structure.

20. The cover system of claim 18, wherein the seal member is spliced, mitered or otherwise joined together with the cover.

* * * * *